United States Patent
Gauthier et al.

(10) Patent No.: US 6,664,831 B2
(45) Date of Patent: *Dec. 16, 2003

(54) CIRCUIT FOR POST-SILICON CONTROL OF DELAY LOCKED LOOP CHARGE PUMP CURRENT

(75) Inventors: Claude Gauthier, Fremont, CA (US); Brian Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/131,687

(22) Filed: Apr. 24, 2002

(65) Prior Publication Data

US 2003/0201809 A1 Oct. 30, 2003

(51) Int. Cl.$^7$ ................................................ H03L 7/06
(52) U.S. Cl. ........................ 327/159; 327/157; 331/17
(58) Field of Search ........................ 327/156, 157–159; 331/1 A, 17, 25

(56) References Cited

U.S. PATENT DOCUMENTS

| | | | | |
|---|---|---|---|---|
| 5,315,270 A | * | 5/1994 | Leonowich | 331/1 A |
| 5,668,503 A | * | 9/1997 | Gersbach et al. | 331/1 A |
| 6,097,227 A | * | 8/2000 | Hayashi | 327/158 |
| 6,140,881 A | * | 10/2000 | Kim | 331/20 |
| 6,222,421 B1 | * | 4/2001 | Kiyose | 331/17 |

OTHER PUBLICATIONS

"Low–Jitter Process–Independent DLL and PLL Based on Self–Biased Techniques" Author: John G. Maneatis As published in: "IEEE Journal of Solid–State Circuits" vol. 31, No. 11, Nov., 1996 (10 pages).

* cited by examiner

Primary Examiner—Timothy P. Callahan
Assistant Examiner—An T. Luu
(74) Attorney, Agent, or Firm—Rosenthal & Osha L.L.P.

(57) ABSTRACT

A charge pump design that facilitates post-fabrication control of delay locked loop charge pump current is provided. The charge pump includes an adjustment device responsive to user controlled signals that are varied to achieve a desired amount of charge pump current. Such control of the charge pump current in a delay locked loop allows a designer to achieve a desired DLL performance characteristic after the DLL has been fabricated.

22 Claims, 5 Drawing Sheets

CIRCUIT FOR POST-SILICON CONTROL OF DELAY LOCKED LOOP CHARGE PUMP CURRENT

BACKGROUND OF INVENTION

To increase processor performance, clock frequencies used by microprocessors, often referred to as "CPUs", have increased. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As processor performance continues to increase, the result has been a larger number of circuits switching at faster rates. Thus, from a design perspective, important considerations, such as switching noise and signal integrity must be taken into account.

As the frequencies of modern computers continue to increase, the need to rapidly transmit data between chip interfaces also increases. To accurately receive data, a clock is often sent to help recover the data. The clock determines when the data should be sampled by a receiver's circuits.

The clock may transition at the beginning of the time the data is valid. The receiver would prefer, however, to have a signal during the middle of the time the data is valid. Also, the transmission of the clock may degrade as it travels from its transmission point. In both circumstances, a delay locked loop, or DLL, can regenerate a copy of the clock signal at a fixed phase shift from the original.

FIG. 1 shows a section of a typical computer system component (5). Data (8) that is 'N' bits wide is transmitted from circuit A (6) to circuit B (7). To aid in the recovery of the transmitted data, a clock signal (9) is also transmitted with the data (8). The circuits could also have a path to transmit data from circuit B (7) to circuit A (6) along with an additional clock (not shown). The clock signal (9) may transition from one state to another at the beginning of the data transmission. Circuit B (7) requires a signal temporally located some time after the beginning of the valid data. Furthermore, the clock signal (9) may have degraded during transmission. The DLL has the ability to regenerate the clock signal (9) to a valid state and to create a phase shifted version of the clock to be used by other circuits, for example, a receiver's sampling signal. The receiver's sampling signal determines when the input to the receiver should be sampled. The performance of a DLL is critical, and the DLL must maintain a proper reference of time on the CPU, or generically, an integrated circuit.

One common performance measure for a DLL is jitter. Jitter is the time domain error from poor spectral purity of an output. In other words, the clock signal (9) plus a known phase shift, should track the DLL output. For a signal with a repeated pattern, such as a clock, a transition that occurs from one state to another that does not happen at the same time relative to other transitions is said to have jitter. Jitter represents the perturbations that result in the intermittent shortening or lengthening of signal elements. The DLL input, clock signal (9), may have jitter that may need to be transmitted to the DLL output. The DLL, however, may need to filter jitter created by power supply noise.

FIG. 2 shows a block diagram drawing of a representative DLL (200). Clock (201) is input to the representative DLL (200) to create a phased (i.e., delayed) output. Clock (201) is used as an input to a voltage-controlled delay line (210) and to a phase detector (202). The phase detector (202) measures whether the phase difference between clock (201) and an output, clk_out (217), of the delay path is correct. An adjustment in the phase delay produces signals that control a charge pump (204). The phase detector (202) indicates that the charge pump (204) should increase or decrease its output using control signals up, U (203), and down, D (205). Furthermore, internal biasing of the charge pump (204) is dependent on bias signals $V_{BP}$ (209) and $V_{BN}$ (211). The control signals up, U (203), and down, D (205), adjust the current output of the charge pump (204) based on the nominal current set by the control voltages, $V_{BP}$ (209) and $V_{BN}$ (211).

The charge pump (204) adds or removes charge from a capacitor $C_1$ (206), that changes a DC value at the input of a bias-generator (208). The capacitor, $C_1$ (206), is connected between a power supply, $V_{DD}$, and a control voltage (or control signal), $V_{CTRL}$ (207). The bias-generator (208) produces control voltages (or bias voltages), $V_{BP}$ (209) and $V_{BN}$ (211), in response to the control voltage, $V_{CTRL}$ (207), that control the delay of the voltage-controlled delay line (210).

In FIG. 2, the voltage-controlled delay line (210) may be implemented using current starved elements. This means that the delays are controlled by modifying the amount of current available for charging and discharging capacitances. The linearity of a voltage controlled delay line's characteristics determines the stable range of frequencies over which the delayed lock loop can operate. Clk_out (217) from the voltage-controlled delay line (210) provides a phase delayed copy of clock (201) to other circuits.

Still referring to FIG. 2, the negative feedback in the loop adjusts the delay through the voltage-controlled delay line by integrating the phase error that results between the periodic reference input, clock (201), and clk_out (217). The voltage-controlled delay line (210) will delay clk_out (217) by a fixed amount of time such that a desired delay between clock (201) and clk_out (217) exists. The speed of the DLL response to a phase error is often related to loop bandwidth.

Delay locked loops are basically first order feedback control systems. As such, the delay locked loop can be described in the frequency domain as having a loop gain and a loop bandwidth. The loop bandwidth is the speed at which a signal completes the feedback loop of the delay locked loop to produce an update (i.e., error signal). Ideally, the DLL should have the highest possible bandwidth so that the clock signal and data track each other. Power supply noise will, however, have a certain noise-versus-frequency characteristic that may require the loop bandwidth to be reduced to attenuate the effects of the power supply noise. The loop bandwidth determines to a large degree what portion of power supply noise is translated to output jitter.

SUMMARY OF INVENTION

According to one aspect of the present invention, an integrated circuit comprises a clock path for carrying a clock signal; a power supply path adapted to receive power from a power supply; a delay locked loop connected to the power supply path including a phase detector that detects a phase difference between a clock signal and a delayed clock signal, a charge pump, responsive to the phase detector, that outputs a current on a control signal, a bias generator, responsive to the control signal, that generates a bias voltage, and a voltage-controlled delay line, responsive to the bias voltage, that generates the delayed clock signal; and an adjustment circuit operatively connected to the charge pump, where the adjustment circuit is controllable to adjust the current output from the charge pump.

According to one aspect of the present invention, a delay locked loop comprises a phase detector for detecting a phase difference between a clock signal and a delayed clock signal; a charge pump, responsive to the phase detector, that outputs a current on a control signal; a bias-generator, responsive to the control signal, that generates a bias voltage; a voltage-controlled delay line, responsive to the bias voltage, that generates the delayed clock signal; and an adjustment circuit operatively connected to the charge pump, where the adjustment circuit is controllable to adjust the current output from the charge pump.

According to one aspect of the present invention, a method for modifying an operating characteristic of a delay locked loop comprises producing a delayed clock signal; comparing the delayed clock signal to a clock signal; generating a current signal using a charge pump responsive to the comparing; selectively adjusting the current signal using an adjustment circuit operatively connected to the charge pump; and generating a bias voltage to a voltage-controlled delay line dependent on the selectively adjusting, where the voltage-controlled delay line produces the delayed clock signal.

According to one aspect of the present invention, an integrated circuit comprises delay locked loop means for generating a delayed clock signal where the delay locked loop means includes comparing means for detecting a phase difference between a clock signal and the delayed clock signal, charge pumping means for generating a current on a control signal where the charge pumping means is responsive to the comparing means, bias generating means for generating a bias voltage where the bias generating means is responsive to the control signal, and delaying means for generating the delayed clock signal where the delaying means is responsive to the bias voltage; and adjusting means for adjusting the current output from the charge pump where the charge pumping means is responsive to the adjusting means.

Other aspects and advantages of the invention will be apparent from the following description and the appended claims.

DETAILED DESCRIPTION

Embodiments of the present invention relate to an integrated circuit having a delay locked loop, the delay locked loop including a charge pump and an adjustment circuit operatively connected to the charge pump to modify an operating characteristic of the delay locked loop. Embodiments of the present invention relate to a method for modifying an operating characteristic of a delay locked loop.

More particularly, embodiments of the present invention relate to an adjustment circuit that adjusts an internal bias of a charge pump. The adjustment circuit may change a nominal current produced on the output of the charge pump. The change in current produced on the output of the charge pump adjusts the current output on a control signal. A bias voltage, that is responsive to the control signal, is operatively connected to a voltage-controlled delay line. The adjustment circuit allows modification of the output of the charge pump, and consequently the output of the voltage-controlled delay line, through a test processor unit.

In a DLL, jitter can be a function of various parameters: power supply variation, input and output jitter, loop bandwidth, substrate noise, etc. Although a designer may intend for an integrated circuit to have particular values for these parameters, most of the actual values for these parameters are unknown until the integrated circuit has been fabricated (i.e., in a post-silicon or post-fabrication stage). For example, with respect to the loop dynamics of a DLL (i.e., how quickly the DLL corrects its output), a designer may intend for the loop bandwidth to operate in a particular frequency range. Unfortunately, the loop bandwidth may be affected by many process technology factors in the fabrication process. Because the DLL cannot be redesigned in the post-silicon stage without considerable temporal and monetary expenditures, these constraints may cause the DLL to have a different operating frequency range than designed and poor jitter performance. Accordingly, there is a need for a technique and design that facilitates increased post-silicon control of a DLL.

Figure 1:
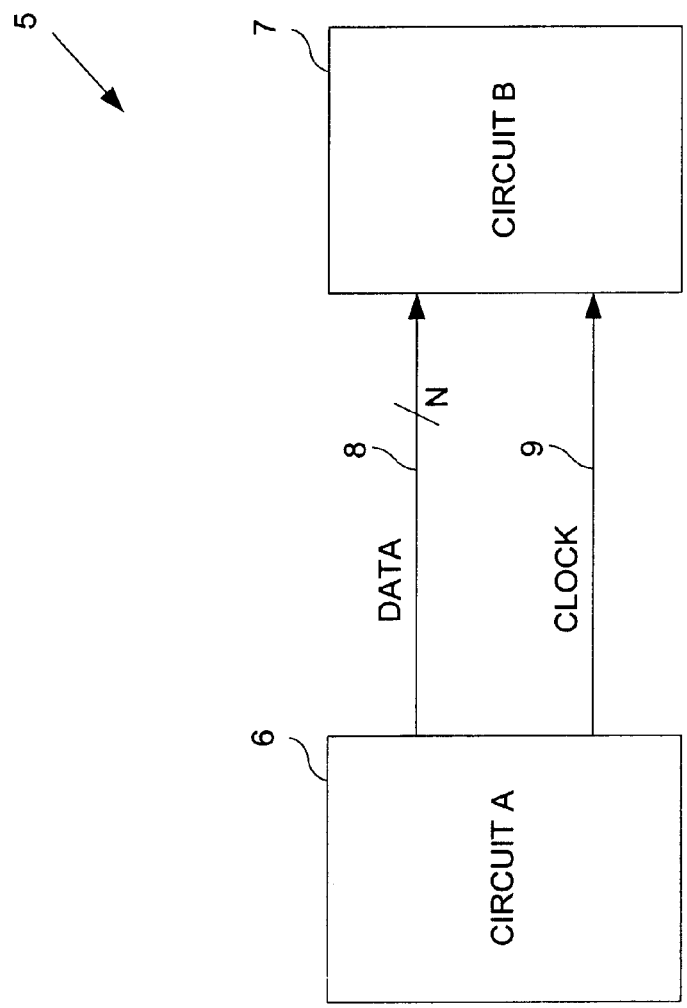
FIG. 1 shows a typical computer system component.
Figure 2:
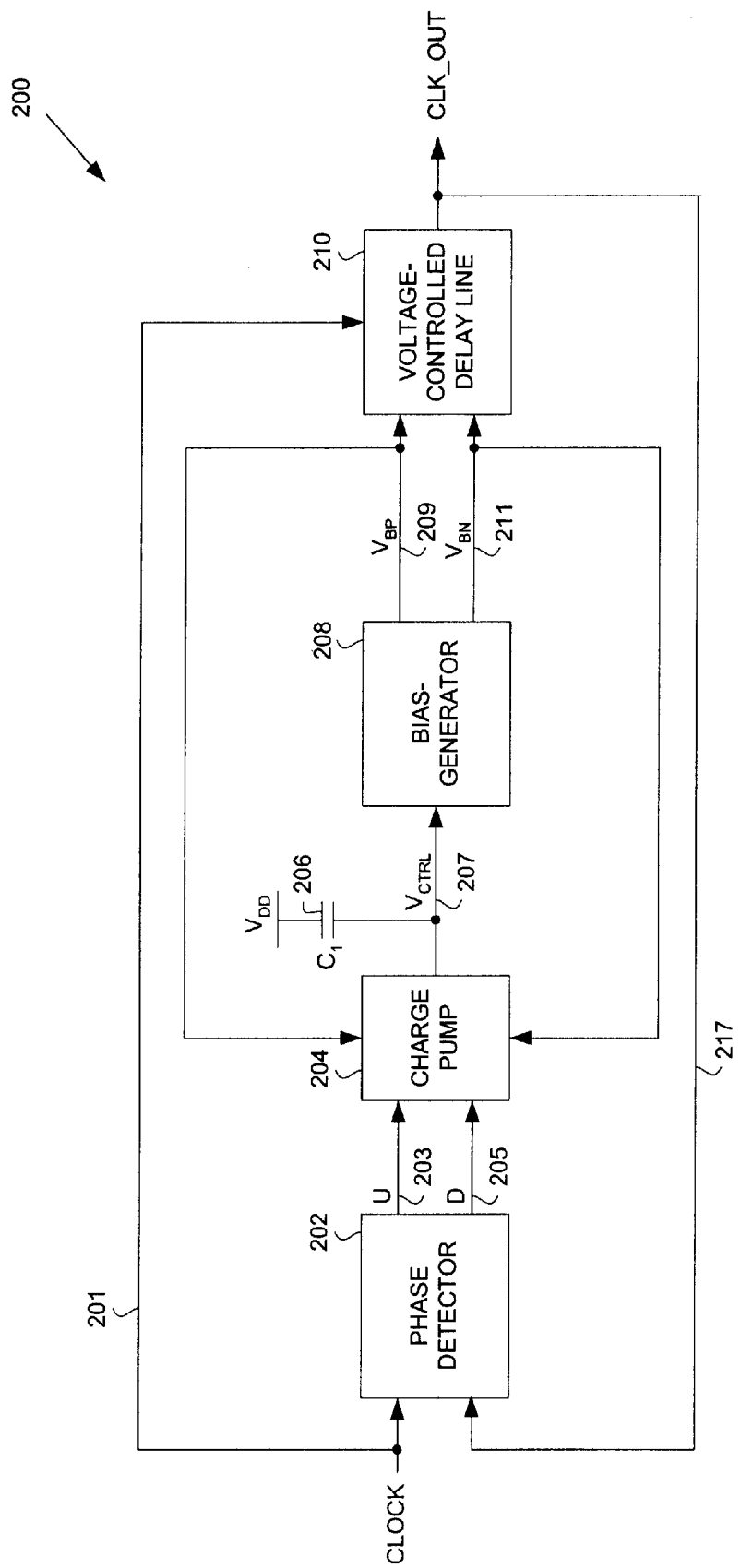
FIG. 2 shows a prior art delay locked loop block diagram.

In FIG. 2, the frequency response of the representative DLL (200) may be analyzed with a Laplace transform approximation, where the sample operation of the phase detector is ignored. This approximation is useful for loop bandwidths about a decade or more below the operating frequency of the DLL. This loop bandwidth constraint is also required for stability due to the reduced phase margin near the higher order poles that result from the delay around the sampled feedback loop. The DLL has a first-order closed loop response. The response could be formulated in terms of input phase and output phase. This set of variables, however, is incompatible with a continuous time analysis since the sampled nature of the system would need to be considered. A better set of variables is input delay and output delay. The output delay is the delay between clock (201) and the DLL output, clk_out (217), or equivalently, the delay established by the voltage-controlled delay line (210). The input delay is the delay for which the phase detector (202) and charge pump (204) generate no error signal. The output delay, $D_O(s)$, is related to the input delay, $D_I(s)$, by the input-to-output transfer function, $D_O(s)/D_I(s)=1/(1+s/p)$, assuming no delay due to noise. The variable p (in rads/s) is the pole of the loop as determined by the charge pump (204) current, the phase detector (202) and voltage-controlled delay line (210) gain, and the capacitor $C_1$(206).

Low loop bandwidth allows the DLL to filter output jitter induced by power supply noise. High loop bandwidth allows the DLL to follow and compensate for input jitter. A design tradeoff must be made in the loop bandwidth of the DLL. Optimizing the DLL loop bandwidth and compensating for any parameter offset caused by process variations after fabrication of the DLL requires a method to adjust the DLL.

Figure 3:
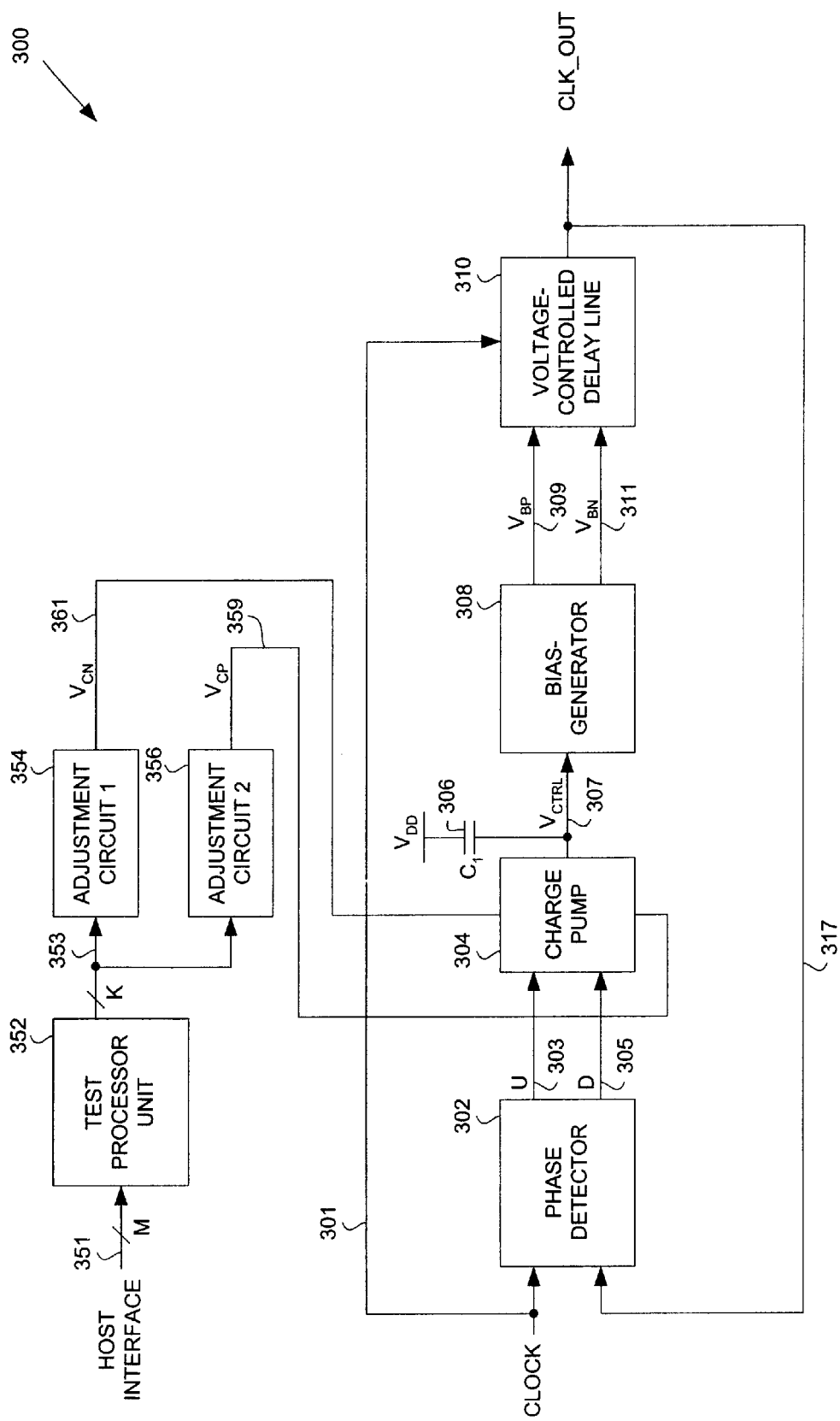
FIG. 3 shows an adjustable delay locked loop block diagram in accordance with an embodiment of the present invention.

FIG. 3 shows an adjustable DLL (300) in accordance with an embodiment of the present invention. The phase detector (302), capacitor $C_1$ (306), bias-generator (308) and voltage-controlled delay line (310) of the adjustable DLL (300) may operate similarly to the representative DLL (200 in FIG. 2) as previously described. The charge pump (304) is modified from the charge pump (204 in FIG. 2) to connect to control voltages $V_{CN}$ (361) and $V_{CP}$ (359), respectively generated from adjustment circuits (354, 356), and a local bias circuit. The adjustment circuits (354, 356) are used to adjust the charge pump (304). The local bias circuit (internal to the charge pump (304)) is used because the control voltages $V_{BP}$ (309) and $V_{BN}$ (311) are no longer connected to the charge pump (304) to set a nominal current output of the charge pump (304) as in FIG. 2.

In FIG. 3, a test processor unit (352) controls the adjustment circuits (354, 356) using multiple control signals K (353). The values of the multiple control signals K (353) are determined by the contents of registers maintained in the test processor unit (352). The test processor unit (352) may be accessed through a host interface. The host interface may communicate with the test processor unit (352) using M communication lines (351). Those with ordinary skill in the art will appreciate that the host interface and M communication lines (351) may take a wide variety of forms. The host interface may be operatively connected to a separate computer system. The communication may be defined by an industry standard.

Those skilled in the art will appreciate that the adjustable DLL (300) may be analog, digital, or a combination of both types of circuits.

Figure 4:
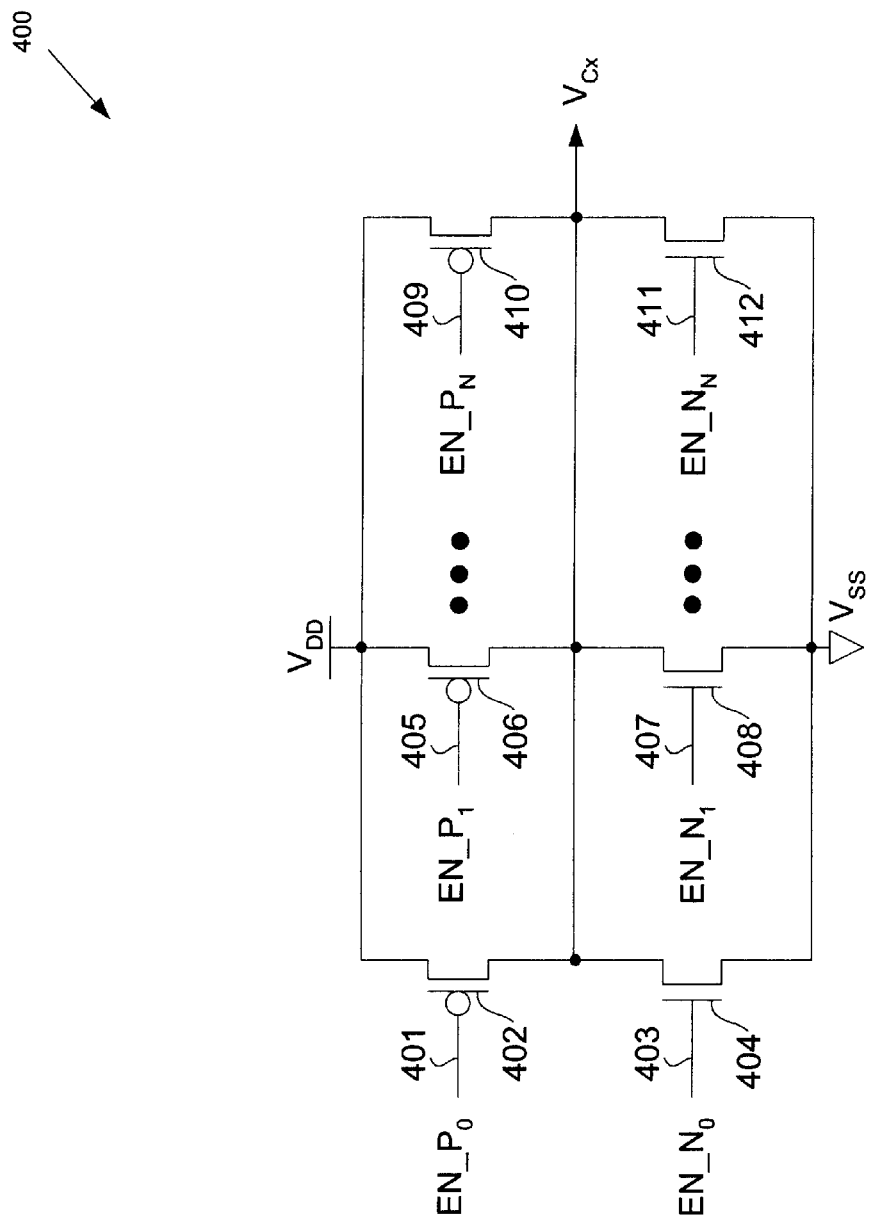
FIG. 4 shows an adjustment circuit in accordance with an embodiment of the present invention.

In FIG. 4, an adjustment circuit (400) in accordance with an embodiment of the present invention is shown. The adjustment circuit may include multiple p-channel transistors (402, 406, 410) arranged in parallel with each other. The multiple p-channel transistors (402, 406, 410) connect between the power supply $V_{DD}$ and a common node, $V_{Cx}$, where "x" is substituted by "N" or "P" depending on the whether the adjustment circuit (400) produces control voltage $V_{CN}$ (361 in FIG. 3) or control voltage $V_{CP}$ (359 in FIG. 3). The adjustment circuit also includes multiple n-channel transistors (404, 408, 412) arranged in parallel with each other. The multiple n-channel transistors (404, 408, 412) connect between ground, $V_{SS}$, and a common node, $V_{Cx}$. Each transistor may have an individual control signal to turn "on" or "off" one or more of the p-channel transistors (402, 406, 410) or n-channel transistors (404, 408, 412). The p-channel transistors (402, 406, 410) have control signals EN_$P_0$ (401), EN_$P_1$ (405), and EN_$P_N$ (409) connected to their gates, respectively. The n-channel transistors (404, 408, 412) have control signals EN_$N_0$ (403), EN_$N_1$ (407), and EN_$N_N$ (411) connected to their gates, respectively. A low voltage on any of the EN_$P_X$ signals (401, 405, 409) will turn "on" their respective p-channel transistors (402, 406, 410). A high voltage on any of the EN_$N_X$ signals (403, 407, 411) will turn "on" their respective n-channel transistors (404, 408, 412).

Any p-channel transistor (402, 406, 410) that is "on" will have a tendency to increase the voltage on $V_{Cx}$ toward $V_{DD}$. Any n-channel transistor (404, 408, 412) that is "on" will have a tendency to decrease the voltage on $V_{Cx}$ toward $V_{SS}$. By selecting which p-channel transistors (402, 406, 410) and/or n-channel transistors (404, 408, 412) are "on", a change in the voltage on $V_{Cx}$ may be achieved.

Those with ordinary skill in the art will appreciate that the p-channel transistors (402, 406, 410) and n-channel transistors (404, 408, 412) may be turned "on" individually or as a group. The p-channel transistors (402, 406, 410) and n-channel transistors (404, 408, 412) may be sized so that each transistor has a different effect compared to the other transistors, specifically the transistor's gate width may be varied to adjust the strength of each transistor. The gate widths may be designed to provide a linear, exponential, or other function as more transistors are turn "on". The p-channel transistors (402, 406, 410) and n-channel transistors (404, 408, 412) may be sized so that each transistor has an inherently resistive nature, specifically the transistor gate lengths may be increased (i.e., long channel transistors) to increase the inherent resistance of each transistor. A larger inherent resistance may be advantageous if both a p-channel transistor and a n-channel transistor are "on" simultaneously. The adjustment circuit (400) may include only one p-channel transistor (e.g., p-channel transistor (402)) and one n-channel transistor (e.g., n-channel transistor (404)) connected in series.

The adjustment circuit (400) in FIG. 4 may be used as the adjustment circuits (354, 356) shown in FIG. 3. In FIG. 3, the test processor unit (352) generates a binary control word from registers that determines which n-channel transistors and p-channel transistors are "on" and which are "off" in each of the adjustment circuits (354, 356). Depending on the binary control word maintained in the registers of the test processor unit (352), multiple control signals K (353), that represent EN_$N_X$ signals (403, 407, 411 in FIG. 4) and EN_$P_X$ signals (401, 405, 409 in FIG. 4), may turn "on" or "off" the p-channel transistors (402, 406, 410 in FIG. 4) and n-channel transistors (404, 408, 412 in FIG. 4) in the adjustment circuits (354, 356). The common nodes $V_{CN}$ (361) and $V_{CP}$ (359) of the adjustment circuit (354, 356) may adjust the nominal current output of the charge pump (304).

Figure 5:
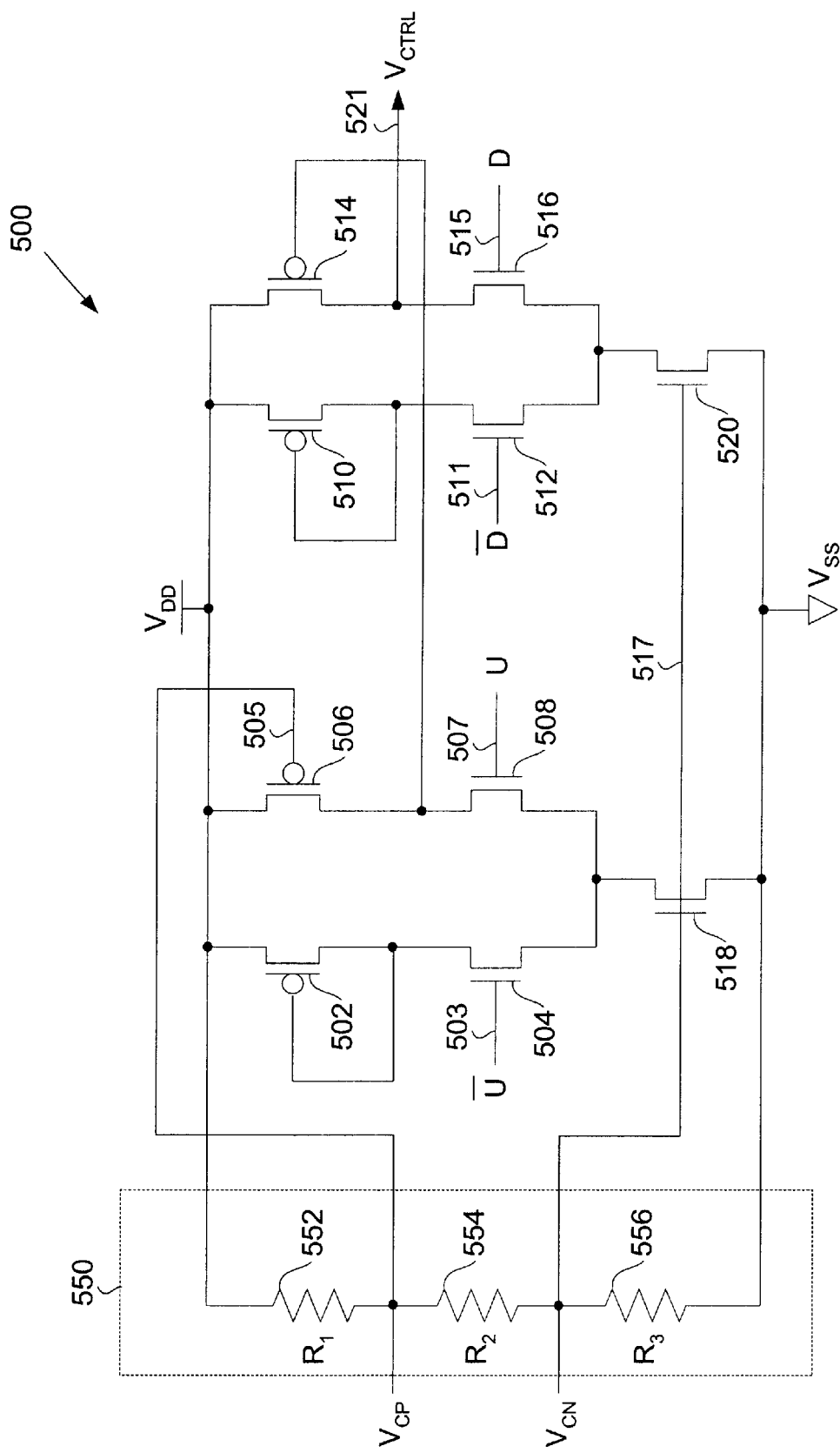
FIG. 5 shows a charge pump in accordance with an embodiment of the present invention.

FIG. 5 shows an adjustable charge pump (500) in accordance with an embodiment of the present invention. FIG. 5 shows an adjustable charge pump (500) that may be used for charge pump (304 in FIG. 3). The charge pump (500) includes an internal biasing circuit (550) that is implemented using a voltage divider formed by resistors $R_1$ (552), $R_2$ (554), and $R_3$ (556). This internal biasing circuit guarantees that the charge pump (500) will have some nominal current. In order to be able to adjust the charge pump current value to achieve a desired operating characteristic, the adjustment circuit control voltages $V_{CN}$ (517) and $V_{CP}$ (505) (also shown in FIG. 3 as control voltages $V_{CN}$ (361) and $V_{CP}$ (359)) are operatively connected to the internal biasing circuit of the adjustable charge pump (500). Thus, depending on the values of the resistors RI (552), $R_2$ (554), and $R_3$ (556) and the adjustment circuit control voltages $V_{CN}$ (517) and $V_{CP}$ (505), a first differential input stage and a second differential input stage control the output, $V_{CTRL}$ (521), of the adjustable charge pump (500), where the first differential input stage is also responsive to U (507) pulses, and its inverse U (503), from the phase detector (302 shown in FIG. 3) and is formed by transistors (502, 504, 506, and 508). The second differential input stage is also responsive to D (515) pulses, and its inverse D (511), from the phase detector (302 shown in FIG. 3), and is formed by transistors (510, 512, 514, and 516). The current flow through the first and second differential input stage is regulated by transistors (518 and 520), respectively, where transistors (518 and 520) are responsive to the internal biasing circuit (550) and adjustment control voltages $V_{CN}$ (517) and $V_{CP}$ (505).

One of ordinary skill in the art will appreciate that even though multiple adjustment circuits (400) may be connected to the adjustable charge pump (500), it is possible that a few or none of the adjustment circuits may have an effect on the adjustable DLL (300). The adjustment circuits may be turned "off". Furthermore, an adjustment circuit (400) may be operatively connected to the adjustable charge pump (500) to affect a change in an operating characteristics of the adjustable DLL (300).

Advantages of the present invention may include one or more of the following. In some embodiments, because an adjustment circuit may modify the operating characteristics of the adjustable DLL (300), an investigation of the adjustable DLL (300) response during operating conditions may be performed. The adjustable DLL (300), having been fabricated, demonstrates characteristics that may not have been apparent from simulation. Realistic results help determine appropriate values for circuit elements within the adjustable DLL (300) and help alleviate costly over design.

In some embodiments, because the adjustable DLL (300) may be fabricated with a means for adjusting the current output of the charge pump (304), fewer design iterations and higher confidence in the adjustable DLL operating characteristics may be afforded. Likewise, the adjustable DLL (300) response to various system disturbances such as power supply noise and system clock jitter may be realistically determined.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a clock path for carrying a clock signal;
    a power supply path adapted to receive power from a power supply;
    a delay locked loop connected to the power supply path, comprising:
        a phase detector that detects a phase difference between a clock signal and a delayed clock signal,
        a charge pump, responsive to the phase detector, that outputs a current on a control signal,
        a bias generator, responsive to the control signal, that generates a bias voltage, and
        a voltage-controlled delay line, responsive to the bias voltage, that generates the delayed clock signal; and
    an adjustment circuit operatively connected to the charge pump, wherein the adjustment circuit, independent of the delayed clock signal is controllable to adjust the current output from the charge pump.

2. The integrated circuit of claim 1, wherein the adjustment circuit comprises a first switch to provide current flow between a first voltage provided by the power supply path and an output of the adjustment circuit, and a second switch to provide current flow between a second voltage provided by the power supply path and the output of the adjustment circuit.

3. The integrated circuit of claim 1, wherein the adjustment circuit comprises a first p-channel transistor and a first n-channel transistor, wherein the first p-channel transistor and the first n-channel transistor are connected in series.

4. The integrated circuit of claim 3, the adjustment circuit further comprising:
    a second p-channel transistor connected in parallel with the first p-channel transistor; and
    a second n-channel transistor connected in parallel with the first n-channel transistor, wherein the first p-channel transistor and second p-channel transistor are in series with the first n-channel transistor and second n-channel transistor.

5. The integrated circuit of claim 4, wherein the first p-channel transistor is a longer channel transistor than the second p-channel transistor.

6. The integrated circuit of claim 4, wherein the first n-channel transistor is a longer channel transistor than the second n-channel transistor.

7. The integrated circuit of claim 4, wherein the first p-channel transistor is a wider gate width transistor than the second p-channel transistor.

8. The integrated circuit of claim 4, wherein the first n-channel transistor is a wider gate width transistor than the second n-channel transistor.

9. The integrated circuit claim 1, further comprising:
    a test processor unit, wherein the test processor unit generates a binary control word.

10. The integrated circuit of claim 9, wherein the adjustment circuit is responsive to the binary control word.

11. A delay locked loop comprising:
    a phase detector for detecting a phase difference between a clock signal and a delayed clock signal;
    a charge pump, responsive to the phase detector, that outputs a current on a control signal;
    a bias-generator, responsive to the control signal, that generates a bias voltage;
    a voltage-controlled delay line, responsive to the bias voltage, that generates the delayed clock signal; and
    an adjustment circuit operatively connected to the charge pump, wherein the adjustment circuit, independent of the delayed clock signal, is controllable to adjust the current output from the charge pump.

12. The delay looked loop of claim 11, wherein the adjustment circuit comprises a first switch to provide current flow between a first voltage and an output of the adjustment circuit, and a second switch to provide current flow between a second voltage and the output of the adjustment circuit.

13. A method for modifying an operating characteristic of a delay locked loop, comprising:
    producing a delayed clock signal;
    comparing the delayed clock signal to a clock signal;
    generating a current signal using a charge pump responsive to the comparing;
    selectively adjusting the current signal using an adjustment circuit operatively connected to the charge pump, wherein the adjustment circuit operates independent of the delayed clock signal; and
    generating a bias voltage to a voltage-controlled delay line dependent on the selectively adjusting, wherein the voltage-controlled delay line produces the delayed clock signal.

14. The method of claim 13, wherein selectively adjusting the current signal comprises controlling a first current flow between a first voltage and an output of the adjustment circuit, and controlling a second current flow between a second voltage and the output of the adjustment circuit.

15. The method of claim 13, wherein selectively adjusting the current signal is performed by an adjustment circuit, wherein the adjustment circuit comprises a first p-channel transistor and a first n-channel transistor, wherein the first p-channel transistor and the first n-channel transistor are connected in series.

16. The method of claim 15, the adjustment circuit further comprising:
    a second p-channel transistor connected in parallel with the first p-channel transistor; and
    a second n-channel transistor connected in parallel with the first n-channel transistor, wherein the first p-channel transistor and second p-channel transistor are in series with the first n-channel transistor and second n-channel transistor.

17. The method of claim 16, wherein the first p-channel transistor is a longer channel transistor than the second p-channel transistor.

18. The method of claim 16, wherein the first n-channel transistor is a longer channel transistor than the second n-channel transistor.

19. The method of claim 16, wherein the first p-channel transistor is a wider gate width transistor than the second p-channel transistor.

20. The method of claim 16, wherein the first n-channel transistor is a wider gate width transistor than the second n-channel transistor.

21. The method of claim 13, wherein selectively adjusting the current signal is controlled by a test processor unit.

22. An integrated circuit, comprising:

delay locked loop means for generating a delayed clock signal, wherein the delay locked loop means comprises:
   comparing means for detecting a phase difference between a clock signal and the delayed clock signal,
   charge pumping means for generating a current on a control signal, wherein the charge pumping means is responsive to the comparing means,
   bias generating means for generating a bias voltage, wherein the bias generating means is responsive to the control signal, and
   delaying means for generating the delayed clock signal, wherein the delaying means is responsive to the bias voltage; and adjusting means for adjusting the current output from the charge pump, wherein the charge pumping means is responsive to the adjusting means, and wherein the adjusting means operates independent of the delayed clock signal.

* * * * *